United States Patent [19]

Ushifusa et al.

[11] Patent Number: 4,620,264

[45] Date of Patent: Oct. 28, 1986

[54] MULTI-LAYER CERAMIC WIRING CIRCUIT BOARD AND PROCESS FOR PRODUCING THE SAME

[75] Inventors: Nobuyuki Ushifusa; Satoru Ogihara, both of Hitachi; Kosei Nagayama, Ibaraki, all of Japan

[73] Assignee: Hitachi, Ltd., Tokyo, Japan

[21] Appl. No.: 685,133

[22] Filed: Dec. 21, 1984

[30] Foreign Application Priority Data

Dec. 23, 1983 [JP] Japan ................................ 58-243351

[51] Int. Cl.$^4$ ............................................. H05K 1/03
[52] U.S. Cl. ................... 361/414; 174/68.5; 428/209
[58] Field of Search ..................... 174/68.5; 361/414; 428/209, 309.9, 310.5

[56] References Cited

U.S. PATENT DOCUMENTS

| 2,859,794 | 11/1958 | Barr | 428/312.6 |
| 3,772,748 | 11/1973 | Rutt, II | 174/68.5 X |
| 3,829,356 | 8/1974 | Rutt | 174/68.5 X |
| 4,141,055 | 2/1979 | Berry et al. | 174/68.5 X |
| 4,237,006 | 12/1980 | Niwa et al. | 174/68.5 X |
| 4,382,236 | 5/1983 | Suzuki | 428/209 |
| 4,387,131 | 6/1983 | Anderson et al. | 428/309.9 |

OTHER PUBLICATIONS

Anderson et al., Low–Dielectric Glass Substrate, IBM Tech. Disc. Bull., vol. 14 #9, Feb. 1972, p. 2581, relied on.

C. M. McIntosh, Multilayer Ceramic Sandwiches, IBM Tech. Disc. Bull., vol. 16 #1, Jun. 1973, p. 43, relied on.

*Primary Examiner*—R. R. Kucia
*Attorney, Agent, or Firm*—Antonelli, Terry & Wands

[57] ABSTRACT

A multi-layer ceramic wiring board consisting of alternately laminated ceramic insulating substrates and wiring conductor layers in which the inner-layer ceramic insulating substrates contacting the inside layers of signal wiring conductor are made of a ceramic insulator having a relative dielectric constant of 6.0 or below and a relatively low density and the ceramic insulating substrates of other layers are made of a ceramic insulator having a tensile strength of 4 kgf/mm$^2$ or above and a relatively high density. In preparation of the board, each of the inner-layer ceramic insulating substrates is preferably formed from a green sheet obtained by drying a thin layer of a slurry containing 70 to 90 parts of ceramic filler particles having a particle size of 5 μm or greater and 30 to 10 parts of glass powder while each of other ceramic insulating substrates is preferably formed from a green sheet obtained by drying a thin layer of a slurry containing 70 to 90 parts of ceramic filler particles having a particle size of less than 5 μm and 30 to 10 parts of glass powder.

10 Claims, 2 Drawing Figures

MULTI-LAYER CERAMIC WIRING CIRCUIT BOARD AND PROCESS FOR PRODUCING THE SAME

BACKGROUND OF THE INVENTION

1. Field of the Invention

This invention relates to a multi-layer ceramic wiring circuit board. More particularly, it relates to a multi-layer ceramic wiring circuit board suitable for constituting a functional module by mounting pins or leads for input or output and semiconductor parts, and a process for producing such a circuit wiring board.

2. Description of the Prior Art

Ceramic substrates are increasingly used as insulating substrates for multi-layer wiring circuit boards for mounting semiconductor parts at high density. Most of these ceramic insulating substrates are made of a sintered body basically composed of alumina ($Al_2O_3$), and a typical example of such substrate is shown in "A Multi-Layer Ceramic, Multi-Chip Module" in the proceedings of the 30th Electronic Component Conference of IEEE (1980), pp. 283-285. The most serious drawback of the substrates using an aluminabased sintered body as insulator is the low signal propagation speed. This is attributable to the following fact. Generally, signal propagation speed is inversely proportional to the square root of relative dielectric constant of the insulator surrounding the signal wiring. The relative dielectric constant of alumina is as high as about 10, so that the sintered body composed mainly of alumina necessarily has a high relative dielectric constant which is usually on the order of 9.0 to 10.0.

For eliminating such defect of low signal propagation speed, a substrate using an insulator with a small relative dielectric constant is needed. For instance, when a sintered body composed principally of mullite ($3Al_2O_3 \cdot 2SiO_2$) is used as insulator, a ceramic substrate with a relative dielectric constant of the order of 5.5 to 7.0 can be obtained. Also, if a sintered body having fine pores in the insulator becomes available, it will be possible to make the relative dielectric constant of the sintered body smaller than that intrinsic to the base material. However, such insulator substrate is low in strength and involves the problem of insufficient mechanical and thermal strength of the surface for mounting the pins or leads for input and output and for mounting and securing the electrical parts such as semiconductor parts.

SUMMARY OF THE INVENTION

The object of this invention is to provide a multi-layer ceramic wiring circuit board which is high in signal propagation speed and has sufficiently high surface strength for mounting the pins or leads for input and output and electrical parts such as semiconductor elements.

The multi-layer ceramic wiring circuit board according to this invention is characterized in that the inner layers of ceramic insulating substrates contacting the signal wirings for transmission of signals are made of a ceramic sintered body with a relatively low density and having a relative dielectric constant of 6.0 or less, and the other layers of ceramic insulating substrates are made of a ceramic sintered body having a tensile strength of 4 kgf/mm² or above and a relatively high density greater than that of said inner layers of ceramic insulating substrate. These features of this invention have realized a great improvement of thermal and mechanical strength of the outer layers of ceramic insulating substrate on which the electrical parts and other necessary elements such as pins and leads are mounted, and also have done much for enhancing the propagation speed of the inside signal wiring.

The production process of the multi-layer ceramic wiring circuit board according to this invention is characterized by using the ceramic green sheets obtained by drying a thin layer of a slurry containing 70 to 90 parts of ceramic filler particles having an average particle size less than 5 $\mu$m and 30 to 10 parts of glass powder, and the similar ceramic green sheets obtained by drying a thin layer of a slurry containing 70 to 90 parts of ceramic filler particles having an average particle size of 5 $\mu$m or greater and 30 to 10 parts of glass powder, printing a conductor paste on both sides of each of said green sheets according to a predetermined circuit pattern, placing said latter green sheets in layers so as to form inner layers while placing said former green sheets to form outer layers, laminating said layers of green sheets under pressure and sintering the laminate.

The density of said "ceramic sintered body with a relatively low density" is preferably less than 90% in terms of relative density (the ratio of actual density to theoretical density), while the density of said "ceramic sintered body with a relatively high density" is preferably 90% or above in terms of relative density. It is also desirable that the difference in relative density between the "ceramic sintered body with a relatively low density" and the "ceramic sintered body with a relatively high density" is 5% or greater.

Preferably, said inner layers of ceramic insulating substrate are principally composed of ceramic filler particles having an average particle size of 5 $\mu$m or greater, and such filler particles preferably have a hollow portion. The expression "the particles have a hollow portion" used here means that every one of the particles (monocrystal or polycrystal) has a hollow portion in its inside, and such hollow portion may partly open to the outside of the particle.

Other layers of ceramic insulating substrate are preferably composed principally of ceramic filler particles having an average particle size less than 5 $\mu$m.

It is desirable that both the inner layers and the other layers of ceramic insulating substrate of this invention are composed of ceramic filler particles and glass. In this case, the amount of glass in the inner layers is desirably less than that in the other layers. The "glass" referred to herein is of the type which is softened and melted at the time of baking of the ceramic.

The component of the particulate ceramic filler used in this invention is selected from mullite, alumina, silica, magnesia, calcia and their mutual compounds. A preferred example of alumina is corundum. Preferred examples of silica include quartz, quartz glass (which is also called amorphous silica glass, not melted under the ceramic baking condition but melted at 1,713° C.), cristobalite, tridymite and the like. The "mutual compounds" of said materials include, for example, $Mg_2Al_4Si_5O_{18}$, $Ca_2SiO_4$, $Ca_3SiO_5$, $CaMgSiO_4$, $Mg_3Al_2(SiO_4)_3$, $MgSiO_3$, $Mg_2SiO_4$, $Al_2SiO_4$ and the like.

The "ceramic filler particles contained in said latter green sheets" are preferably the hollow particles having a particle size of 100 $\mu$m or above.

The glass powder used for either former or latter ceramic green sheets is preferably one which consists of 51.3% by weight of $SiO_2$, 34.9% by weight of $Al_2O_3$ and 13.8% by weight of MgO.

According to this invention, a ceramic sintered body having a low density and a small relative dielectric constant is used for the insulator of inner layers and a ceramic sintered body having a high density and an excellent thermal and mechanical strength is used for the insulator of surface layers where thermal and mechanical stresses are given by mounting of leads or pins and electrical parts such as semiconductor elements, so that there is provided a high-reliability multi-layer ceramic wiring circuit board having a high signal propagation speed and excellent mounting and holding strength.

DETAILED DESCRIPTION OF THE PREFERRED EMBODIMENTS

Figure 1:
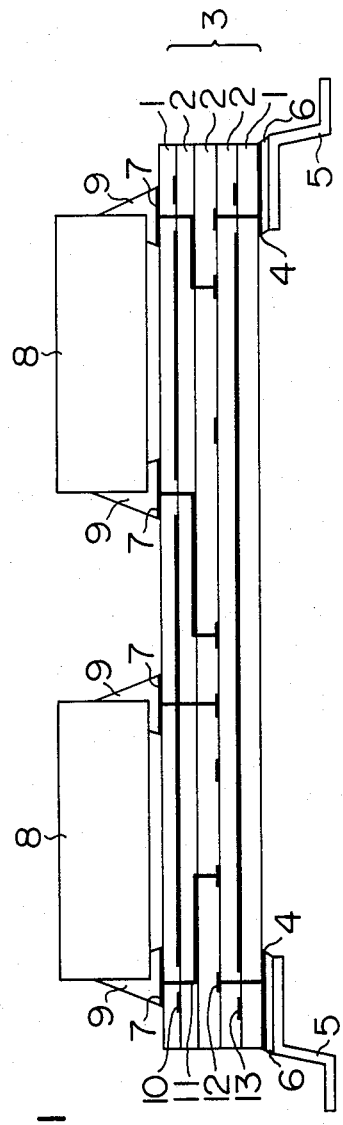
FIG. 1 and FIG. 2 are sectional views showing the laminate layer structures in the different embodiments of multi-layer ceramic wiring circuit board according to this invention and functional modules constituted by using such laminate structures.

A preferred embodiment of multi-layer wiring circuit board according to this invention is shown in FIG. 1 in a schematic sectional view. In the drawing, 1 designates the insulating substrates forming both outer layers, and 2 denotes the insulating substrates forming the inner layers. These substrates are laminated in close attachment to each other to constitute a multi-layer laminate substrate 3. It will be seen that a layer of surface wiring conductor 7 is formed on the surface of the insulating substrate 1 forming the top outer layer in the drawing, and a layer of power source conductor 10 is disposed along the interface between said substrate 1 and the adjoining inner-layer substrate 2. Also, a layer of surface wiring conductor 4 is formed on the surface of the insulating substrate 1 forming the bottom outer layer, and a layer of ground conductor 13 is disposed along the interface between said substrate 1 and the adjoining inner-layer substrate 2. Said layer of ground conductor is also called earth layer. Further, signal wiring layers 11 and 12 are formed between the adjoining inner-layer substrates 2. These conductor layers are shown by heavy lines in the drawing. The individual conductor layers are also connected to each other by a specific throughhole conductor indicated by vertical heavy lines in the drawing. Also in the drawing, 5 designates Kovar leads connected to the surface conductor 4 by gold-tin solder 6, and 8 denotes chip carriers made of alumina-based ceramic and joined to the surface conductor 7 by solder 9.

The insulating substrates 1 forming both outer layers are a high-density ceramic sintered body composed principally of ceramic filler particles with an average particle size of less than 5 μm and also containing glass. This ceramic sintered body has a tensile strength of 4 kgf/mm² or above and also has sufficient thermal and mechanical strength for secure mounting and retention of leads 5 and chip carriers 8.

On the other hand, the insulating substrates 2 forming the inner layers are made of a ceramic sintered body with a relatively low density, this sintered body being principally composed of ceramic filler particles with a particle size of 5 μm or greater and also containing the same glass as contained in the above-mentioned substrates 1. This ceramic sintered body has a small relative dielectric constant which is 6 or below, and owing to this small relative dielectric constant of the inner-layer insulating substrates, the signal propagation delay time of the signal wiring layers 11 and 12 held between said inner-layer substrates 2 is reduced to the order of 8 ns/m.

Figure 2:
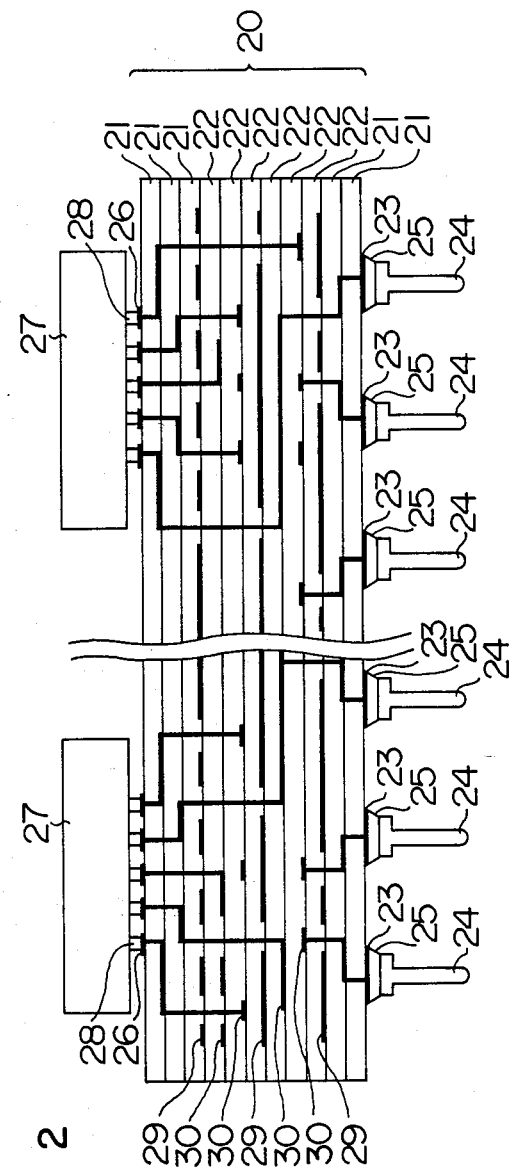

FIG. 2 illustrates a multi-layer wiring circuit board in accordance with another embodiment of this invention. In the drawing, 21 indicates the insulating substrates forming the outer layers, and 22 refers to the insulating substrates forming the inner layers, and these insulating substrates are laminated integrally to constitute a multi-layer substrate 20. Layers of surface wiring conductors 23 and 26 are formed on the surfaces of the outermost layers of insulating substrate 21, and layers of connecting wiring conductor and layers of power source or ground conductor 29 are formed between the outer-layer and inner-layer insulating substrates 21 and 22 and between part of the inner-layer insulating substrates 22. Also, layers of signal wiring conductor 30 are formed between the inner-layer insulating substrates 22. These conductor layers are shown by heavy lines. It will be also noted that the respective conductor layers are connected to each other by specific throughhole conductors shown by vertical heavy lines in the drawing. 24 in the drawing designates Kovar pins joined to the respective surface conductor layers 23 by gold-tin solder 25, and 27 denotes silicon semiconductor elements joined to the surface conductor layers 26 by solder 28.

Insulating substrates 21 forming the outer layers are a ceramic sintered body identical with the counterpart 1 in the embodiment of FIG. 1 and also have sufficient thermal and mechanical strength like said counterpart. The inner-layer insulating substrates 22 are made of the same ceramic sintered body as the inner-layer insulating substrates 2 in the embodiment of FIG. 1 and have a low relative dielectric constant like the latter, and accordingly the signal propagation delay time of the signal wiring layers 30 held by said inner-layer insulating substrates 22 is reduced as in the preceding embodiment.

Ceramic filler particles used in these embodiments are most preferably mullite or quartz particles. Also, hollow mullite particles having a particle size of 100 μm or greater can be used as the ceramic filler particles contained in the inner-layer ceramic insulating substrates 2 and 22.

The process for producing the multi-layer wiring circuit board according to this invention will be described below by way of examples thereof. In the following description, all "parts" and "%" are by weight unless otherwise noted.

EXAMPLE 1

5.9 parts of polyvinyl butyral was added to 70 parts of pulverized mullite ($3Al_2O_3.2SiO_2$) having an average particle size smaller than 5 μm and 30 parts of a powdered glass material having a composition of $SiO_2/Al_2O_3/MgO = 51.3/34.9/13.8$ (by weight), and they were put into a ball mill and dry mixed for 3 hours. Then, 1.9 part of butyl butylphthalylglycolate, 124 parts of trichloroethylene, 32 parts of tetrachloroethylene and 44 parts of n-butylalcohol were further added into said ball mill and subjected to wet mixing for 20 hours to form a slurry. The slurry was deaerated by vacuum degassing. Then this slurry was coated on a polyethylene film support to a thickness of 0.2 mm by using a doctor blade and dried by passing through an oven to make mullite green sheets.

Separately from the above, there were produced similar mullite green sheets by following the same procedure as described above except that 70 parts of pulverized mullite (3Al$_2$O$_3$.2SiO$_2$) having an average particle size of 5 μm or greater (not greater than 325 meshes) in place of 70 parts of pulverized mullite (3Al$_2$O$_3$.2SiO$_2$) having an average particle size smaller than 5 μm.

Each of these green sheets was cut to a size of 200 mm×200 mm and provided with throughholes at predetermined positions by punching. Then a conductor paste having a composition of pulverized tungsten/nitrocellulose/ethyl cellulose/polyvinyl butyral/trichloroethylene=100/3/1/2/23 (by weight) was screen printed on both the sides of each green sheet to form a predetermined circuit pattern. Said conductor paste was also filled into the throughholes for interlaminar connection.

By using the mullite green sheets using pulverized mullite having an average particle size smaller than 5 μm for the outer-layer insulating substrates 1 shown in FIG. 1 while using the mullite green sheets using pulverized mullite having an average particle size of 5 μm or greater (not greater than 325 meshes) for the inner-layer insulating substrates 2, these mullite green sheets, 5 in all, were orderly placed one upon another by positioning the guide holes and laminated under pressure at 90° C. as shown in FIG. 1. The thus formed laminate of green sheets was placed in a baking furnace and baked in a nitrogen atmosphere containing 3 to 7% by volume of hydrogen and a small quantity of water vapor at a highest temperature of 1,600° C. for one hour to complete a multi-layer ceramic wiring circuit board such as shown in FIG. 1.

In the thus produced multi-layer ceramic wiring circuit board, the two outer-layer insulating substrates 1 (forming the surface layers) are small in particle size and high in density, or 95% or more in relative density, while the other (inner-layer) insulating substrates 2 are large in particle size and have minute voids dispersed uniformly therein. These inner-layer insulating substrates 2 had a relative density of approximately 85% and a relative dielectric constant of 5.5. The adhesion between these substrates was excellent. After performing electroless nickel plating and gold plating on both the sides of the laminate, Kovar leads 5 were joined to the surface conductor layers 4 by gold-tin solder 6 in the usual way using a carbon jig. Also, chip carriers 8 made of alumina-based ceramic were joined to the surface conductor layers 7 by solder 9. The tensile strength of said leads was above 1 kg/pin. The solder joints 9 of chip carriers 8 remained free of disconnection even after more than 3,000 heating-cooling cycles between +150° C. and −65° C. Thus, the joints had enough strength to insure sufficient durability even under harsh use conditions.

On the other hand, the signal propagation delay time of wiring layers 11 and 12 between the inner-layer insulating substrates 2 held by power source layer 10 and ground layer 13 was 7.7 ns/m. This stands in contrast with the relative dielectric constant of 5.5 of the inner-layer insulating substrates 2. In the conventional multi-layer wiring circuit board in which all of the layered substrates are made of an alumina-based sintered body, the relative dielectric constant of the laminate substrate is about 9.5 and the signal propagation delay time is 10.2 ns/m, so that according to the present embodiment of this invention, the signal propagation delay time is reduced to 75% of that in the conventional circuit board.

EXAMPLE 2

Such a multi-layer ceramic wiring circuit board 20 as illustrated in FIG. 2 was manufactured by following the same procedure as in Example 1, except that pulverized mullite having an average particle size of 5 μm or greater (not greater than 325 meshes) was replaced by hollow particles of mullite having a particle size of approximately 100 μm. In this case, the outer-layer insulating substrates 22 were constituted with said mullite green sheets using pulverized mullite having an average particle size smaller than 5 μm, while the inner-layer insulating substrates were formed with said mullite green sheets using hollow particles of mullite having a particle size of approximately 100 μm. The adhesion between the adjoining substrates was fast. After electroless nickel and gold plating, Kovar pins 24 were joined to the surface conductor layers 23 by gold-tin solder 25 in the usual way using a carbon jig, and silicon semiconductor elements 27 were joined facedown to the surface conductor layers 26 directly by solder 28.

The tensile strength of the pins was greater than 4 kg/pin, high enough to stand practical use. The solder joints 28 of silicon semiconductor elements 27 remained free of disconnection even after more than 2,000 heating-cooling cycles between +150° C. and −65° C., indicating sufficient joint durability even under harsh use conditions. This can be attributed to the following fact: since the coefficient of thermal expansion of the sintered body principally composed of mullite is on the order of 38–50×10$^{-7}$/°C., which is close to that of silicon semiconductor, there is no great difference in elongation between substrate and silicon semiconductor, at the time of heating, and accordingly no much stress is exerted to the solder joints. In case of the conventional alumina substrates, the coefficient of thermal expansion thereof is 60–70×10$^{-7}$/°C. which widely differs from that of silicon semiconductor, so that much stress is given to the solder joints at the time of heating, which tends to cause early disconnection of the joints.

The signal propagation delay time of signal wiring layers 30 between inner-layer insulating substrates 22 held by power source layer and ground layer 29 was 7.3 ns/m. This small delay time owes to the hollow particles of mullite used as filler of insulating substrates 22 and presents a contrast with the measured value 5.1 of relative dielectric constant of said insulating substrates 22. Thus, by using hollow particles to constitute a closed-cell structure, the signal propagation delay time can be reduced to about 72% of that of the conventional multi-layer wiring circuit board in which all of the laminated substrates are made of an alumina-based sintered body (in the latter case, relative dielectric constant is about 9.5 and signal propagation delay time is 10.2 ns/m).

EXAMPLE 3

Such a multi-layer ceramic wiring circuit board as illustrated in FIG. 1 was produced by following the same process as in Example 1, except that a mullite green sheet made by using d90 parts of pulverized mullite (3Al$_2$O$_3$.2SiO$_2$) having an average particle size of 5 μm or greater and 10 parts of a powdered glass material having a composition of SiO$_2$/Al$_2$O$_3$/MgO=51.3/34.9/13.8 (by weight) was used as ceramic material for forming the inner-layer insulating substrates 2 while a mullite green sheet made by using 70 parts of pulverized mullite (3Al$_2$O$_3$.2SiO$_2$) having an average particle size smaller than 5 μm and 30 parts of a powdered glass material having a composition of SiO$_2$/Al$_2$O$_3$/MgO=51.3/34.9/13.8 (by weight) was used as ceramic material for forming the outer-layer insulating substrates 1. The ceramic material with 90 parts of pulverized mullite was not sufficiently baked under the baking conditions of the ceramic material with 70 parts of pulverized mullite, and the baked structure contained fine voids. The adhesion between substrates in this multi-layer wiring circuit board was good. After conducting electroless nickel and gold plating on both the sides of the laminate Kovar leads were joined to the surface conductor layers 4 by gold-tin solder in the usual way using a carbon jig while chip carriers 8 made of a ceramic composed mainly of highly heat-conductive and electrical insulating silicon carbide were joined to the surface conductor layers 7 by solder 9.

The leads showed a tensile strength above 1 kg/pin, which is a strength that can tolerate practical use. Also, the solder joints 9 of chip carriers sufferred no disconnection even after more than 3,000 heating-cooling cycles between +150° C. and −65° C., indicating a strength that insures sufficient joint life even under harsh use conditions.

The signal propagation delay time of signal wiring layers between inner-layer insulating substrates 2 held by power source layer 10 and ground layer 9 was 8.0 ns/m. This value offers a contrast with the measured value 5.9 of relative dielectric constant of said insulating substrates 2. In the conventional multi-layer wiring circuit board in which all of the laminated substrates are made of an alumina-based sintered body, the relative dielectric constant is about 9.5 and the signal propagation delay time is 10.2 ns/m, so that according to the present embodiment of the invention, the signal propagation delay time is reduced to 78% of that in said conventional circuit board.

EXAMPLE 4

Multi-layer ceramic wiring circuit boards were produced according to the same procedure as in Examples 1-3, except that the pulverized ceramic filler and powdered glass material used were of the compositions shown in the table below. The adhesion between substrates in these boards was good. After applying electroless nickel and gold plating, Koval leads or Koval pins were joined to the lower surface conductor layers in the usual way using a carbon jig while chip carriers or silicon semiconductors were joined to the upper surface conductor layers by soldering.

In all the boards, the tensile strength of the leads was above 1 kg/pin and that of the pins was above 4 kg/pin. These values ensure enough strength of said elements to stand practical use. The solder joints of chip carriers or silicon semiconductor elements remained safe from disconnection even after more than 2,000 heating-cooling cycles between +150° C. and −65° C., indicating sufficient durability even under harsh use conditions.

The signal propagation delay time of signal wiring between inner-layer insulating substrates held by power source layer and ground layer differs depending on the ceramic filler material and glass material used as shown in the table. Relative dielectric constant of these insulating substrates is also shown in the table. It will be seen that in the ceramic insulating substrates of any compositions according to this invention, the signal propagation delay time is significantly reduced in comparison with the conventional alumina-based insulating substrates (alumina content being more than 90%), and thus these ceramic substrates of this invention can contribute to the reduction of computer machine cycle time.

TABLE

| No. | Composition of ceramic filler | Composition of glass material (wt %) | | | | Signal propagation delay time (ns/m) | Relative dielectric constant |
| --- | --- | --- | --- | --- | --- | --- | --- |
| | | Al$_2$O$_3$ | SiO$_2$ | MgO | | | |
| 1 | 3Al$_2$O$_3$.2SiO$_2$ | 34.86 | 51.36 | 13.78 | | 7.7 | 5.5 |
| 2 | " | 31.37 | 56.22 | 12.40 | | 7.7 | 5.5 |
| 3 | " | 27.89 | 61.08 | 11.03 | | 7.6 | 5.4 |
| 4 | " | 24.40 | 65.95 | 9.65 | | 7.5 | 5.4 |
| 5 | " | 20.92 | 70.81 | 8.27 | | 7.4 | 5.4 |
| 6 | " | 17.43 | 75.68 | 6.89 | | 7.2 | 5.3 |
| 7 | SiO$_2$ (quartz) | 34.86 | 51.36 | 13.78 | | 7.3 | 5.4 |
| 8 | " | 31.37 | 56.22 | 12.40 | | 7.2 | 5.4 |
| 9 | " | 27.89 | 61.08 | 11.03 | | 7.2 | 5.3 |
| 10 | " | 24.40 | 65.95 | 9.65 | | 7.2 | 5.3 |
| 11 | " | 20.92 | 70.81 | 8.27 | | 7.1 | 5.3 |
| 12 | " | 17.43 | 75.68 | 6.89 | | 7.1 | 5.2 |
| 13 | Al$_2$O$_3$ | 34.86 | 51.36 | 13.78 | | 9.8 | 9.2 |
| 14 | " | 31.37 | 56.22 | 12.40 | | 9.7 | 9.1 |
| 15 | " | 27.89 | 61.08 | 11.03 | | 9.6 | 9.1 |
| 16 | " | 24.40 | 65.95 | 9.65 | | 9.5 | 9.0 |
| 17 | " | 20.92 | 70.81 | 8.27 | | 9.5 | 9.0 |
| 18 | " | 17.43 | 75.68 | 6.89 | | 9.4 | 9.0 |
| 19 | MgO.Al$_2$O$_3$ | 34.86 | 51.36 | 13.78 | | 10.0 | 9.4 |
| 20 | " | 31.37 | 56.22 | 12.40 | | 10.0 | 9.4 |
| 21 | " | 27.89 | 61.08 | 11.03 | | 9.9 | 9.4 |
| 22 | " | 24.40 | 65.95 | 9.65 | | 9.9 | 9.3 |
| 23 | " | 20.92 | 70.81 | 8.27 | | 9.9 | 9.3 |
| 24 | " | 17.43 | 75.68 | 6.89 | | 9.8 | 9.2 |
| 25 | 3Al$_2$O$_3$.2SiO$_2$ | 30.0 | 50.0 | 9.0 | CaO 6.0 | 7.5 | 5.4 |
| 26 | SiO$_2$ (quartz) | " | " | " | " | 7.1 | 5.2 |
| 27 | Al$_2$O$_3$ | " | " | " | " | 9.6 | 9.1 |
| 28 | MgO.Al$_2$O$_3$ | " | " | " | " | 9.7 | 9.2 |
| 29 | 2CaO.SiO$_2$ | " | " | " | " | 9.4 | 9.0 |
| 30 | 3Al$_2$O$_3$.2SiO$_2$ | " | " | " | BaO 6.0 | 7.5 | 5.4 |
| 31 | SiO$_2$ (quartz) | " | " | " | " | 7.1 | 5.2 |
| 32 | Al$_2$O$_3$ | " | " | " | " | 9.6 | 9.1 |

TABLE-continued

| No. | Composition of ceramic filler | Composition of glass material (wt %) | | | Signal propagation delay time (ns/m) | Relative dielectric constant |
| --- | --- | --- | --- | --- | --- | --- |
| | | Al$_2$O$_3$ | SiO$_2$ | MgO | | |
| 33 | MgO·Al$_2$O$_3$ | " | " | " | " | 9.7 | 9.1 |

What is claimed is:

1. A multi-layer ceramic wiring circuit board, comprising:
a plurality of ceramic insulating substrate layers;
at least one wiring conductor layer betweeen selected ceramic insulating substrate layers, said plurality of insulating substrate layers and said at least one wiring conductor layer forming a laminated stack having at least one outer ceramic insulating substrate layer and at least one inner ceramic insulating substrate layer, said at least one inner ceramic insulating substrate layer contacting at least one selected wiring conductor layer; wherein,
said at least one inner ceramic insulating substrate layer has a relative dielectric constant less than or equal to 6.0 and a relative density of less than 90%;
said at least one outer ceramic insulating substrate layer has a tensile strength of at least 4 kgf/mm$^2$ and a relative density greater than or equal to 90%; and
said at least one outer ceramic insulating substrate layer is made of a material containing the same compounds as are contained in the material of which said at least one inner ceramic insulating layer is made.

2. A multi-layer ceramic wiring circuit board according to claim 1, wherein the difference in relative densities between said at least one inner ceramic insulating substrate layer and said at least one outer ceramic insulating substrate layer is greater than or euqal to 5%.

3. A multi-layer ceramic wiring circuit board according to claim 2, wherein said material of which said ceramic insulating substrate layers are made comprises a particulate ceramic filler and glass.

4. A multi-layer ceramic wiring circuit board according to claim 1, wherein said at least one inner ceramic insulating substrate layer is made of an insulating ceramic comprised principally of ceramic filler particles having an average particle size of 5 μm or greater and said at least one outer ceramic insulating substrate layer is made of an insulating ceramic comprised principally of ceramic filler particles having an average particle size of less than 5 μm.

5. A multi-layer ceramic wiring circuit board according to claim 1, wherein said at least one inner ceramic insulating substrate layer is made of an insulating ceramic comprised principally of hollow ceramic filler particles.

6. A multi-layer ceramic wiring circuit board according to claim 1, wherein said ceramic insulating substrate layers are made of an insulating ceramic comprised of ceramic filler particles and glass, and said at least one inner ceramic insulating substrate layer is smaller in glass content than said at least one outer ceramic insulating substrate layer.

7. A multi-layer ceramic wiring circuit board according to claim 3, wherein the particulate ceramic filler is selected from the group consisting of mullite, silica and compounds thereof.

8. A multi-layer ceramic wiring circuit board, according to claim 6, wherein said ceramic insulating substrate layers are comprised of 70–90 parts by weight of ceramic filler particles and 10–30 parts by weight of glass.

9. A multi-layer ceramic wiring circuit board according to claim 3, wherein said particulate ceramic filler is mullite.

10. A multi-layer ceramic wiring circuit board according to claim 2, wherein said at least one inner ceramic insulating substrate layer is between at least two outer ceramic insulating substrate layers.

* * * * *